United States Patent
Su et al.

(10) Patent No.: US 6,855,225 B1
(45) Date of Patent: Feb. 15, 2005

(54) SINGLE-TUBE INTERLACED INDUCTIVELY COUPLING PLASMA SOURCE

(75) Inventors: Yuh-Jia Su, Cupertino, CA (US); David Lee Chen, San Jose, CA (US); Vincent Bernard Decaux, San Francisco, CA (US)

(73) Assignee: Novellus Systems, Inc., San Jose, CA (US)

( * ) Notice: Subject to any disclaimer, the term of this patent is extended or adjusted under 35 U.S.C. 154(b) by 142 days.

(21) Appl. No.: 10/351,032

(22) Filed: Jan. 24, 2003

Related U.S. Application Data

(60) Provisional application No. 60/391,373, filed on Jun. 25, 2002.

(51) Int. Cl.[7] .............................. C23C 16/00; C23F 1/00
(52) U.S. Cl. ................ 156/345.48; 118/723 I; 315/111.51
(58) Field of Search .................. 118/723 I, 723 IR, 118/723 AN; 156/345.48, 345.49; 315/111.51

(56) References Cited

U.S. PATENT DOCUMENTS

| | | | | |
|---|---|---|---|---|
| 4,849,675 A | * | 7/1989 | Muller | 315/111.51 |
| 6,007,675 A | | 12/1999 | Toshima | 156/345 |
| 6,077,384 A | * | 6/2000 | Collins et al. | 156/345.29 |
| 6,224,680 B1 | | 5/2001 | Toshima | 118/719 |
| 6,527,912 B2 | * | 3/2003 | Chen et al. | 156/345.48 |
| 6,744,213 B2 | * | 6/2004 | Wilcoxson et al. | 315/111.51 |

* cited by examiner

*Primary Examiner*—Luz Alejandro-Mulero
(74) *Attorney, Agent, or Firm*—Silicon Valley Patent Group LLP

(57) ABSTRACT

A plasma source for use in, for example, semiconductor processing contains a radio-frequency generator, an impedance matching network, and a coil that encloses a tube. The coil is bifilar, i.e., the turns of one are interlaced with the turns of a second winding. The matching network supplies only a single coil in the plasma source, unlike conventional arrangements wherein a single matching network supplies multiple coils in the plasma source.

14 Claims, 6 Drawing Sheets

SINGLE-TUBE INTERLACED INDUCTIVELY COUPLING PLASMA SOURCE

This application claims the priority of U.S. Provisional Application No. 60/391,373, filed Jun. 25, 2002.

FIELD OF THE INVENTION

This invention relates to the formation of plasmas for use in semiconductor processing and in particular to the formation of an inductively-coupled plasma.

BACKGROUND OF THE INVENTION

Plasmas are widely used in the semiconductor industry for depositing thin films, for etching thin films and the underlying semiconductor material, and for dry-cleaning wafers. The plasma is typically formed in a cylindrical vessel or tube around which a wire is coiled. The reactant gases are introduced into one end of the tube and the atoms or ions that are generated by the plasma exit the other end of the tube and flow towards the wafer. Power is applied to the plasma by means of the coil. The mechanism by which the electrical power is transferred to the plasma can be either capacitive or inductive. Normally, both modes are present but one of the modes is predominant. In many applications the inductive mode is preferred because it produces a plasma having a higher ion density and because the ions in the plasma do not bombard the walls of the tube as much as they do when the plasma operates in the capacitive mode. This reduces wear on the tube and increases its life.

One structure for generating a plasma is described in U.S. Pat. No. 6,007,675 (FIGS. 2, 2B, 5A, 5B and 7) and U.S. Pat. No. 6,224,680 (FIGS. 2, 2B, 5 and 6). Both of these arrangements include a plurality of plasma tubes that generate plasmas used in a corresponding plurality of processing stages. As shown in FIG. 1, the coils are arranged in pairs 10, 12, and each pair of coils is connected to an RF generator 14 through a single impedance-matching network 16, which contains a phase angle detector 22, a control motor 24 and a variable capacitor 26. Phase angle detector 22 detects the phase difference between the signal produced by RF generator 14 and the signal in coils 10, 12 and actuates motor 24 and in turn variable capacitor 26 so as to drive the phase difference towards zero. As shown, coils 10, 12 are interconnected, and the coil around each of the tubes 18, 20 is interlaced, i.e., each coil consists of two windings, with the individual turns of each winding embedded between turns of the other winding. Ideally, the power supplied through the matching network 16 would be shared equally by the two tubes 18, 20.

In practice, it has been found that this structure has several defects. The plasma operates primarily in the capacitively coupling mode when the power supplied to each tube is less than about 500W. For example, when the plasma is used to strip bulk photoresist, it has been found that the coupling mode changes abruptly from capacitive to inductive when the power supplied to each tube increases beyond about 600–700W. This is shown in FIG. 2, which is a graph of ion density of the plasma versus power per tube. The ion density levels off at about $6.0E+11$ ions/cm$^3$ at 600–700W and increases rapidly above 750W, indicating that the coupling in this region becomes inductively coupling rich.

Moreover, in the arrangement shown in FIG. 1 the power supplied to the tubes 18, 20 is not in fact balanced. Typically, one of the tubes receives more power through normal perturbations, and this condition worsens as the power is delivered to the path of least resistance. Also, the reaction rate (e.g., the photoresist stripping rate) is limited by the available power.

SUMMARY OF THE INVENTION

These problems are overcome in an arrangement according to this invention, wherein a single tube is supplied with electrical power through a separate impedance match network. There is no direct electrical connection between the coils which enclose different tubes. Each of the coils is bifilar, i.e., each coil contains at least two windings that have turns that are interlaced or interdigitated with the turns of the other winding.

DESCRIPTION OF THE INVENTION

Figure 3:
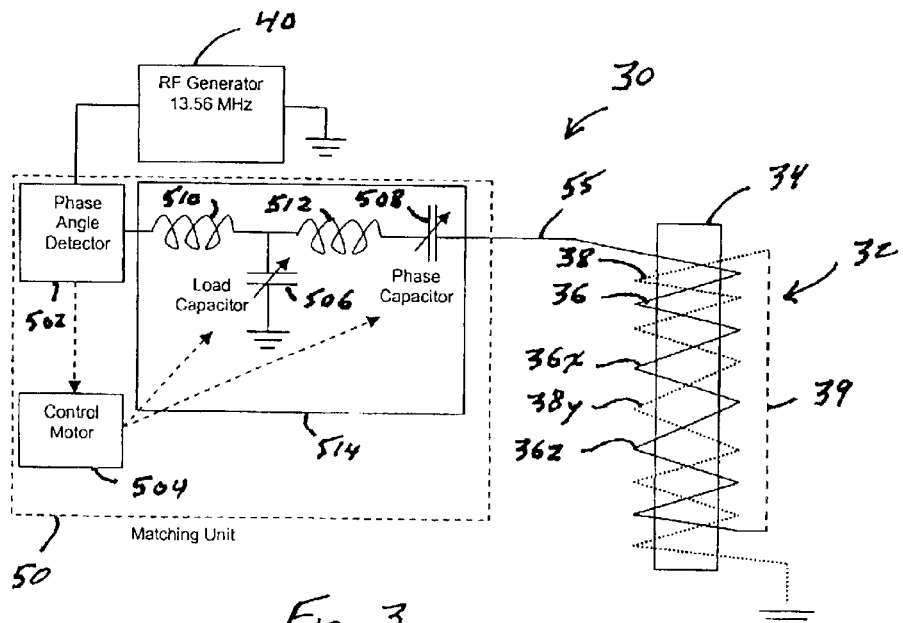
FIG. 3 is a schematic diagram of a plasma source in accordance with this invention.

FIG. 3 is a schematic diagram of a plasma source 30 in accordance with this invention. Plasma source 30 includes a coil 32 which is wrapped around a tube 34.

Coil 32 is supplied by an RF generator 40, which operates at 13.56 MHz and which supplies a signal to coil 32 through an impedance-matching network 50. Impedance-matching network 50 includes a phase angle detector 502 and a control motor 504, which drives a load capacitor 506 and a phase capacitor 508 in an LC circuit 514. Circuit 514 also includes inductances 510 and 512, which are connected in series with phase capacitor 508. Matching network 50 is tuned to the impedance of coil 32 by minimizing the reflected power as seen by phase angle detector 502. The minimal reflected power is achieved through a tuning algorithm in which the positions of capacitors 506 and 508 are controlled by motor 504. To minimize the internal losses in matching network 50, capacitors 506 and 508 are preferably vacuum capacitors.

It should be understood that matching network 50 is only illustrative. Numerous forms of matching networks may be employed in other embodiments of this invention.

Coil 32 includes a first winding 36 (solid lines) and a second winding 38 (dotted lines). Windings 36 and 38 are interlaced or interdigitated, e.g., turn 38y of winding 38 is interposed between adjacent turns 36x and 36z of winding 36. Output line 55 from matching network 50 connects to a first end of winding 36, which is located at a first end of coil 32. The other (second) end of winding 36 is located at a second end of coil 32 and is connected via a return line 39 to a first end of winding 38 that is located at the first end of coil 32. The other (second) end of winding 38 is located at the second end of coil 32 and is connected to ground.

The reactor in which coil 32 is housed typically contains other plasma tubes (not shown) that are connected to impedance-matching networks separate from impedance-matching network 50. This allows independent control of the plasma in each tube, and the plasma in a given tube will not be impacted by the conditions in other tubes.

Figure 4:
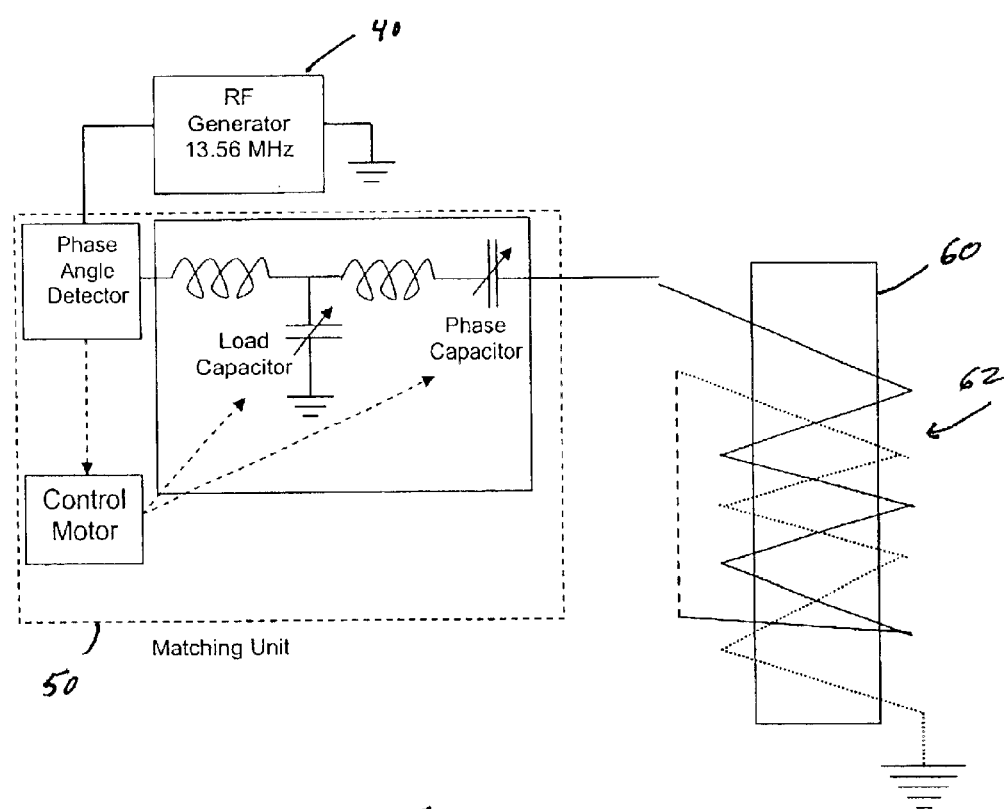
FIG. 4 shows a plasma source similar to the plasma source shown in FIG. 3 but with a larger tube.

As shown in FIG. 4, a different size tube may require a coil with a different number of turns to strike and sustain a uniform plasma. Normally, a larger tube requires fewer turns of inductive coil for the same coil length or uses a lower frequency generator (according to the equation c=λf, discussed below, where λ is the wavelength of the electromagnetic radiation within the tube, f is the frequency of the RF generator and c is the velocity of light). Thus coil 62 around tube 60 shown in FIG. 4 has fewer turns than coil 32 in FIG. 3.

The length of the coil may be set so as to provide a helical resonator, with standing waves in the tube. This requires that the length of the coil be a multiple of the wavelength of the electromagnetic radiation within the tube (λ=c/f).

Figure 5:
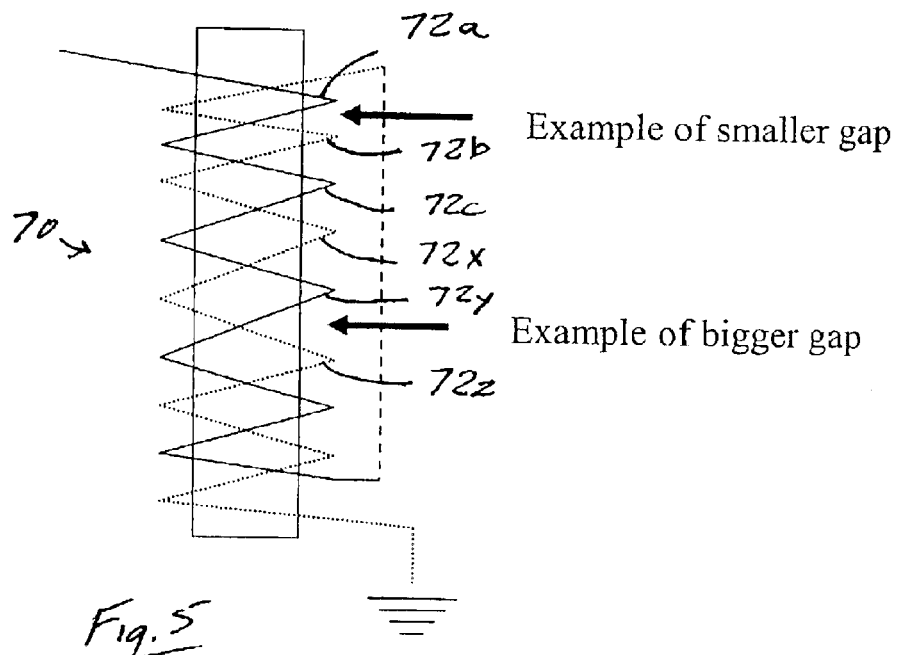
FIG. 5 shows how the turns of the coil may be positioned so as to improve the uniformity of the plasma within the tube.

The pressure within the tube may be not uniform from top to bottom, particularly if the tube has a diameter that is relatively small in comparison to its length. The distribution of the plasma inside the coil can be improved by adjusting the position of the coil. FIG. 5, for example, shows a coil 70 wherein the gaps between turns 72a, 72b and 72c are smaller than the gaps between turns 72x, 72y and 72z.

Figure 6:
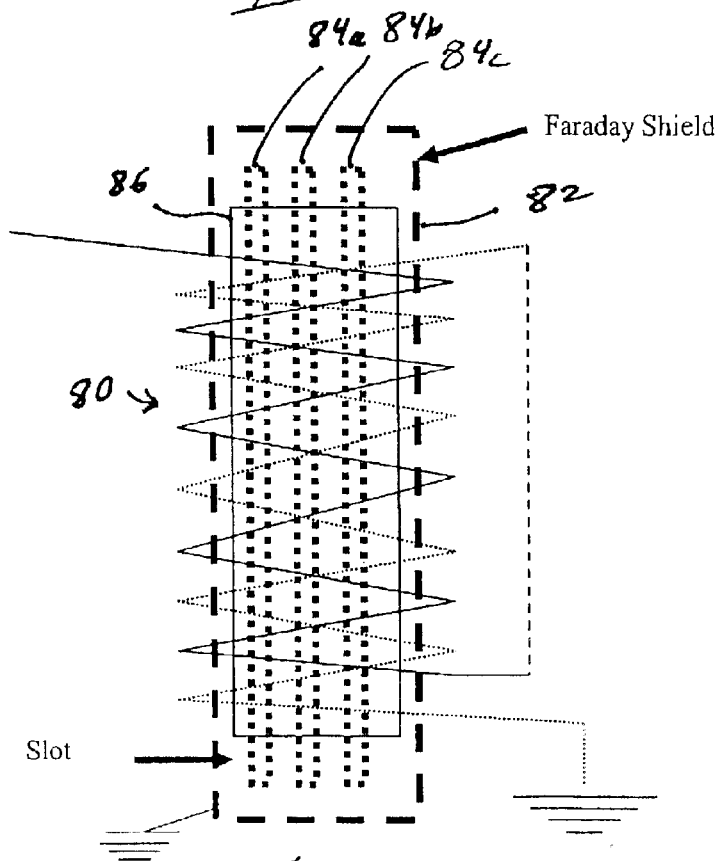
FIG. 6 shows a Faraday shield positioned between the coil and the tube.

The plasma may be further moved in the direction of the inductive coupling mode by positioning a Faraday shield between the coil and the tube. FIG. 6, for example, shows a tubular Faraday shield 82 between coil 80 and plasma tube 86. Slots 84a, 84b and 84c in Faraday shield 82 run perpendicular to the turns of coil 82. An insulating liner could be incorporated into Faraday shield 82 to avoid overheating.

Figure 7:
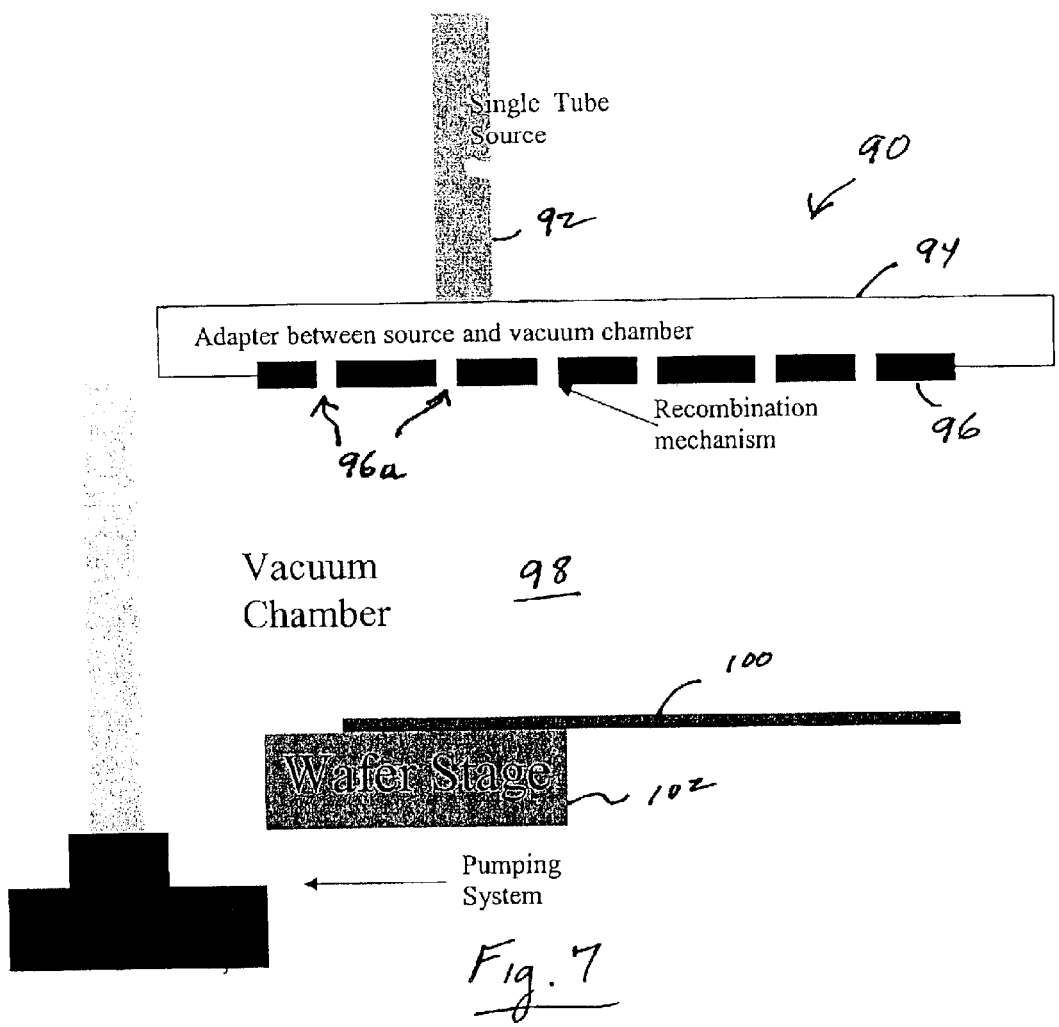
FIG. 7 shows a recombination mechanism positioned between the tube and the vacuum chamber.

If a more neutral species is required for the particular process (e.g., stripping), a recombination mechanism may be placed between the plasma tube and the reaction chamber. In the reactor 90 shown in FIG. 7, a recombination mechanism 96 is attached to an adapter 94 between a plasma tube 92 and a vacuum chamber 98. A wafer 100 is placed on a stage 102 in vacuum chamber 98. In this embodiment, recombination mechanism 96 is a grounded aluminum plate with openings 96a which allow the neutral atoms or molecules to enter vacuum chamber 98. Openings 96a could be in the form of circular holes or elongated slots, for example.

Figure 1:
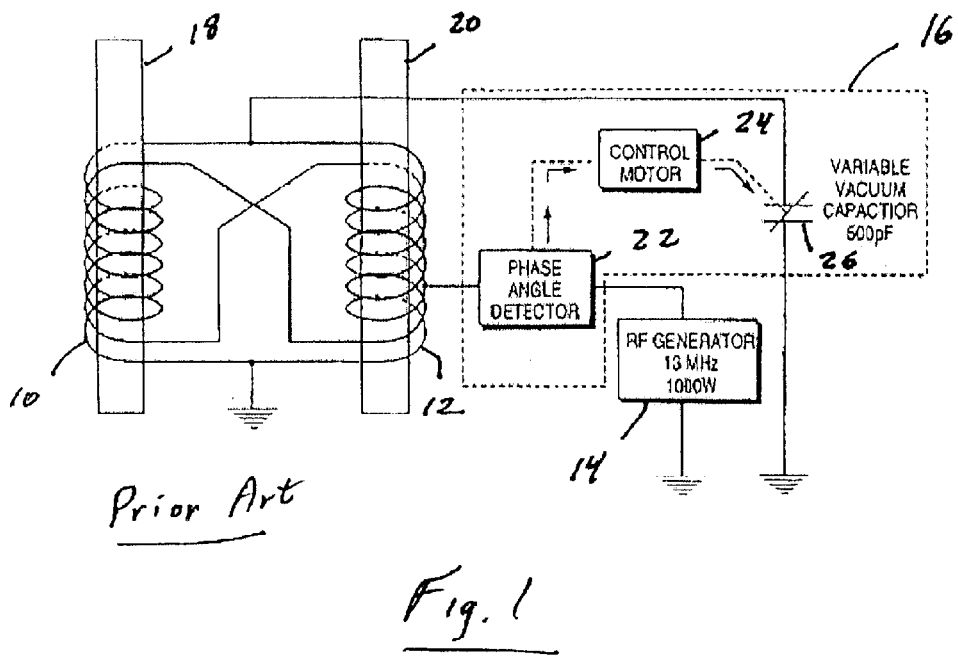
FIG. 1 is a schematic circuit diagram of a prior art plasma source.
Figure 2:
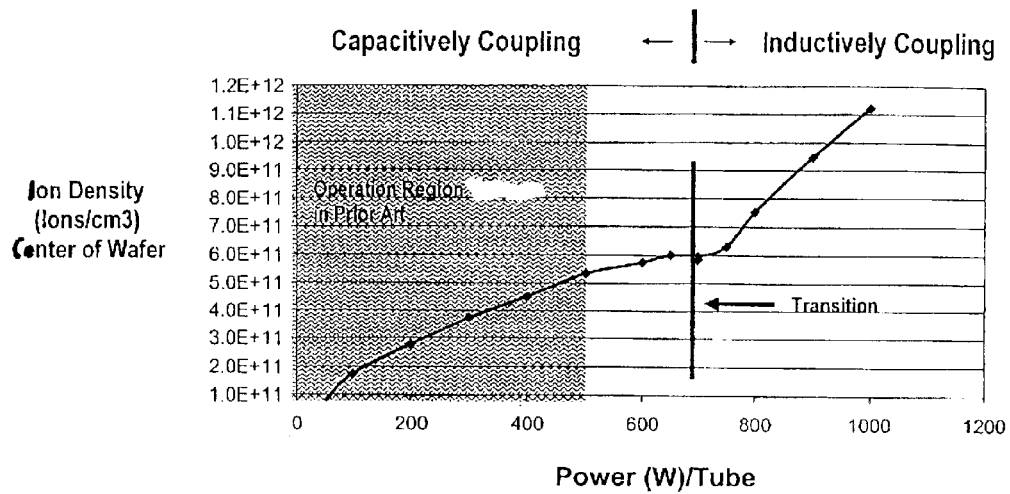
FIG. 2 is a graph of the ion density of the plasma versus the power per tube.
Figure 8:
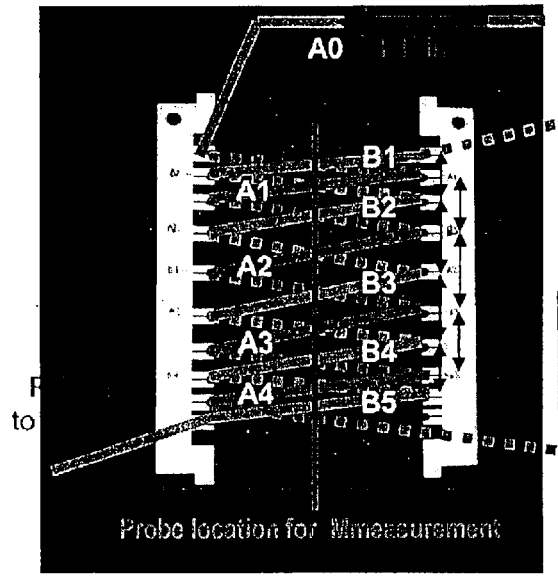
FIGS. 8 and 9 illustrate that the voltage difference between adjacent turns of the coil (delta voltage) is symmetrical.
Figure 9:
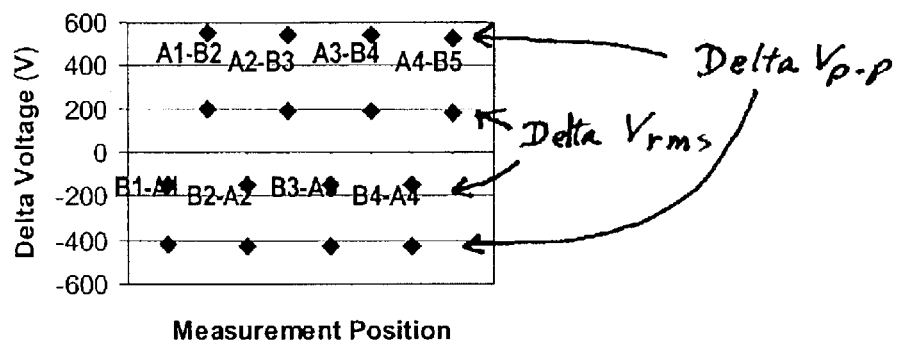

The plasma source of this invention has numerous benefits and advantages. The plasma is easy to strike and sustain. For example, it is possible to strike and sustain a plasma at a power level of only 1W per tube. On the other hand, the power may vary widely, up to 3000W per tube, for example. The reaction rate may greatly increased by using higher power levels. For example, in stripping processes more power may be used to dissociate a higher 02 flow rate. As shown in FIG. 2, this wider range of power allows operation in the inductive coupling mode above 600W without any design changes in the reactor. The plasma can be very dense. As shown in FIG. 2, at power levels above 900W the density of the plasma is greater than E+12 ions/cm$^3$. As shown in FIGS. 8 and 9, the voltage difference between adjacent turns of the coil (delta voltage) is symmetrical, whether the-root mean-square ($V_{rms}$) or peak-to-peak ($V_{p-p}$) voltage is considered. This provides another electrical path which minimizes capacitive coupling into the plasma.

The foregoing embodiments are illustrative only and not limiting. Numerous alternative embodiments will be apparent to persons of skill in the art. The broad scope of the invention is limited only by the following claims.

We claim:

1. A plasma source comprising:
   a vessel for holding a plasma;
   a radio-frequency (RF) generator;
   a matching network supplied by the RF generator; and
   a coil supplied by the matching network, the coil enclosing the vessel and having a first end and a second end, the coil comprising:
      a plurality of windings comprising a first winding having a first end at said first end of said coil and a second end at said second end of said coil, and a second winding having a first end at said first end of said coil and a second end at said second end of said coil; individual turns of said first winding being interposed between individual turns of said second winding; and
      a return line connecting said second end of said first winding to said first end of said second winding.

2. The plasma source of claim 1 wherein said matching network comprises a phase angle detector and a control motor, said phase angle detector supplying an output signal to said control motor.

3. The plasma source of claim 2 wherein said matching network includes an LC circuit, said output signal of said phase angle detector being representative of a phase difference between a signal received by said phase angle detector from said RF generator and a signal reflected to said phase angle detector from said LC circuit.

4. The plasma source of claim 3 wherein said LC circuit comprises a first variable capacitor, the state of said first variable capacitor being controlled by said control motor.

5. The plasma source of claim 4 wherein said LC circuit comprises a second variable capacitor, the state of said second variable capacitor being controlled by said control motor.

6. The plasma source of claim 5 wherein said LC circuit comprises at least one inductance connected in series with one of said first and second variable capacitors.

7. The plasma source of claim 1 wherein said coil functions as a helical resonator, a length of said coil being a multiple of a wavelength of a standing wave in said vessel.

8. The plasma source of claim 1 wherein respective gaps between individual turns of said coil vary along a length of said coil.

9. The plasma source of claim 1 comprising a Faraday shield between said coil and said vessel.

10. The plasma source of claim 9 wherein said Faraday shield comprises a plurality of slots parallel to a length of said coil.

11. The plasma source of claim 1 comprising a recombination mechanism position near a downstream end of said vessel.

12. A plasma source comprising:
   a radio-frequency (RF) generator;
   a vessel for holding a plasma;
   a matching network supplied by the RF generator; and
   a bifilar coil enclosing the vessel and having a first end and a second end, the coil comprising a plurality of windings comprising a first winding having a first end at said first end of said coil and a second end at said second end of said coil, and a second winding having a first end at said first end of said coil and a second end at said second end of said coil, the second end of the first winding being connected via a return line to the first end of the second winding;

wherein said coil is supplied by said matching network and said matching network does not supply any other coil in said plasma source.

13. The plasma source of claim 12 wherein individual turns of said first winding are interposed between individual turns of said second winding.

14. The plasma source of claim 12 wherein said coil comprises only two windings.

* * * * *